(12) United States Patent
Vancha et al.

(10) Patent No.: US 10,803,912 B2
(45) Date of Patent: Oct. 13, 2020

(54) FAST VOLTAGE COMPENSATION WITHOUT FEEDBACK

(71) Applicant: SANDISK TECHNOLOGIES LLC, Addison, TX (US)

(72) Inventors: Yadhu Vamshi Vancha, Pleasanton, CA (US); Ali Al-Shamma, Mountain View, CA (US); Yingchang Chen, Cupertino, CA (US); Jeffrey Lee, Fremont, CA (US); Tz-Yi Liu, Palo Alto, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/251,484

(22) Filed: Jan. 18, 2019

(65) Prior Publication Data

US 2020/0234743 A1  Jul. 23, 2020

(51) Int. Cl.
*G11C 7/06* (2006.01)
*G11C 11/16* (2006.01)

(52) U.S. Cl.
CPC .............. *G11C 7/067* (2013.01); *G11C 7/062* (2013.01); *G11C 11/1673* (2013.01); *G11C 2207/063* (2013.01)

(58) Field of Classification Search
CPC ..... G11C 7/067; G11C 7/062; G11C 11/1673; G11C 2207/063
USPC ....................................................... 365/205
See application file for complete search history.

(56) References Cited

U.S. PATENT DOCUMENTS

| | | | |
|---|---|---|---|
| 4,958,123 A * | 9/1990 | Hughes | G11C 27/028 323/316 |
| 5,289,412 A | 2/1994 | Frary et al. | |
| 5,512,814 A | 4/1996 | Allman | |
| 6,674,679 B1 | 1/2004 | Perner et al. | |
| 6,847,568 B2 | 1/2005 | Gogl et al. | |
| 6,937,052 B2 | 8/2005 | Tam | |
| 8,345,466 B2 | 1/2013 | Maejima et al. | |
| 8,373,491 B2 | 2/2013 | Van Den Bos et al. | |
| 2005/0195657 A1 | 9/2005 | Chen | |
| 2014/0063922 A1* | 3/2014 | Kim | G11C 8/08 365/158 |

(Continued)

OTHER PUBLICATIONS

Allen & Holberg, Holt Rinehart & winston Publishing; dated: 1987, pp. 100-101 (Year: 1987).*

(Continued)

*Primary Examiner* — Fernando Hidalgo
(74) *Attorney, Agent, or Firm* — Michael Best & Friedrich LLP

(57) ABSTRACT

A circuit or associated system or apparatus includes a first transistor, a second transistor, a first switch, a second switch, a first current source, and a third switch. The first transistor is configured to sample a first current of a control line. The second transistor is configured to apply a second current to the control line. The second transistor is also configured to match the second current to the first current. The first switch is connected in series between a control terminal of the first transistor and a control terminal of the second transistor. The second switch is connected in series between the second transistor and the control line. The third switch is connected in series between the first current source and the control line.

11 Claims, 4 Drawing Sheets

(56) References Cited

U.S. PATENT DOCUMENTS

2018/0226134 A1  8/2018  Kim
2018/0233178 A1  8/2018  Kang

OTHER PUBLICATIONS

Huang et al., "Analysis and Design of Internal Compensation for Peak-Current-Mode Converter," 2013 Fourth International Conference on Intelligent Control and Information Processing (ICICIP), 2013, pp. 389-392.

* cited by examiner

FAST VOLTAGE COMPENSATION WITHOUT FEEDBACK

BACKGROUND

This application relates generally to a sense amplifier, such as a memory sense amplifier. More specifically, this application relates to a fast compensation sense amplifier architecture to match read voltages by minimizing differences between load currents and source currents.

A read voltage applied to one or more bit lines in a memory array by a sense amplifier may vary from a read voltage generated by an associated voltage driver. To match these read voltages, it is possible to compensate for the differences between a load current applied to the memory array and a source current in the voltage driver, however, some current compensation techniques and architectures (such as feedback-based current compensation) require a great amount of time to perform current compensation, which results in longer read times, and slower overall performance of the memory.

Accordingly, there exists a need for a memory sense amplifier that performs fast voltage compensation without feedback.

SUMMARY

The disclosure provides a circuit including, in one embodiment, a first transistor, a second transistor, a first switch, a second switch, a first current source, and a third switch. The first transistor is configured to sample a first current of a control line. The second transistor is configured to apply a second current to the control line. The second transistor is also configured to match the second current to the first current. The first switch is connected in series between a control terminal of the first transistor and a control terminal of the second transistor. The second switch is connected in series between the second transistor and the control line. The third switch is connected in series between the first current source and the control line.

The disclosure also provides a system including, in one embodiment, a current adjustment circuit, a detection circuit, and a controller. The current adjustment circuit is coupled to a memory array. The detection circuit is coupled to the current adjustment circuit. The detection circuit is configured to selectively sense a first current received by the memory array. The detection circuit is also configured to communicate, to the current adjustment circuit, a second current approximating the first current. The controller is coupled to the detection circuit and the current adjustment circuit. The controller is configured to manage the detection circuit and the current adjustment circuit such that the first current is proportional to a third current communicated to the current adjustment circuit.

The disclosure also provides an apparatus including, in one embodiment, means for storing data, meaning for sampling a first current applied to the means for storing data upon detection of a memory operation associated with the means for storing data, means for applying a second current to the means for storing data, and means for absorbing a third current from the means for storing data only when the second current is applied to the means for storing data. The means for applying the second current is configured to match the second current to the first current.

In this manner, various aspects of the disclosure provide for improvements in at least the technical fields of memory devices and their design and architecture.

The disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

DETAILED DESCRIPTION

In the following description, numerous details are set forth, such as circuit configurations, waveform timings, circuit operations, and the like, in order to provide an understanding of one or more aspects of the present disclosure. It will be readily apparent to one skilled in the art that these specific details are merely exemplary and not intended to limit the scope of this application.

Figure 1:
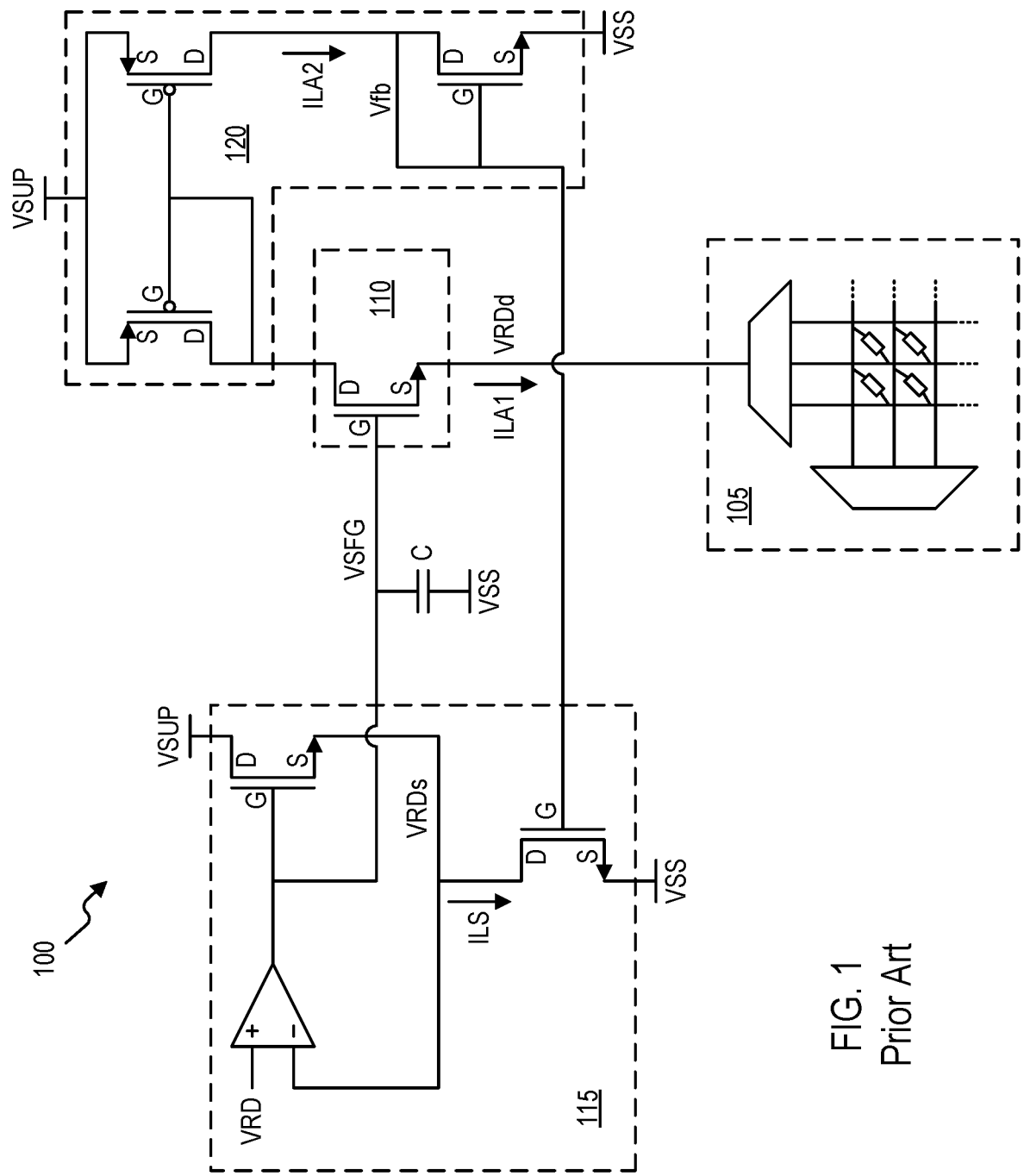
FIG. 1 illustrates a circuit diagram of a sense amplifier configuration with feedback, according to a prior art example.

FIG. 1 illustrates a circuit diagram for an example of a sense amplifier configuration 100 with feedback, as a comparative example. The sense amplifier configuration 100 illustrated in FIG. 1 includes a memory array 105, a sense amplifier circuit 110, a voltage driver 115, and a feedback-based compensation circuit 120. During a read operation of the memory array 105, the sense amplifier circuit 110 applies a read voltage VRDd to the memory array 105 by applying a current load ILA1 to the memory array 105. The sense amplifier circuit 110 applies the current load ILA1 to the memory array 105 under control of a driving signal VSFG generated by the voltage driver 115. The voltage driver 115 generates the driving signal VSFG based on a read voltage VRDs in the voltage driver 115.

Ideally, the read voltage VRDd applied to the memory array 105 matches the read voltage VRDs in the voltage driver 115. However, in practice, differences between these read voltages can exist due to, for example, process and temperature variations. As described in more detail below, the feedback-based compensation circuit 120 adjusts the current load ILA1 such that any differences between the read voltage VRDd applied to the memory array 105 and the read voltage VRDs in the voltage driver 115 are minimized. The feedback-based compensation circuit 120 samples the load current ILA1 applied to the memory array 105 with a current mirror and generates a matching load current ILA2. The feedback-based compensation circuit 120 also generates a feedback signal Vfb based on the matching load current ILA2 with a transistor. The voltage driver 115 receives the feedback signal Vfb and adjusts the driving signal VSFG based on the feedback signal Vfb. In particular, the voltage driver 115 adjusts a source current ILS in the voltage driver 115 based on the feedback signal Vfb, which in turn adjusts the driving signal VSFG based on the feedback signal Vfb. In this manner, the feedback-based compensation circuit 120 adjusts the load current ILA1 applied to the memory array 105 to minimize any differences between the read voltage VRDd applied to the memory array 105 and the read voltage VRDs in the voltage driver 115.

The propagation delay of the driving signal VSFG is affected to the amount of parasitic capacitances present between the voltage driver 115 and the sense amplifier circuit 110. In general, the propagation delay of the driving signal VSFG is longer when the parasitic capacitances present between the voltage driver 115 and the sense amplifier circuit 110 are greater. While FIG. 1 illustrates a single instance of the sense amplifier circuit 110, in practice, several instances of the sense amplifier circuit 110 are operatively connected in parallel to the voltage driver 115. For example, a 16 gigabit memory may include 1,024 instances of the sense amplifier circuit 110. Each instance of the sense amplifier circuit 110 adds an additional parasitic capacitance, which increases the propagation delay of the driving signal VSFG and results in longer and overall slower read times. The capacitor C illustrated in FIG. 1 represents the total parasitic capacitance present between the voltage driver 115 and each instance of the sense amplifier circuit 110. For example, the value of the capacitor C is about 2 picofarads when the sense amplifier configuration 100 includes 1,024 instances of the sense amplifier circuit 110. 2 picofarads of parasitic capacitance results in a propagation delay of about 100 nanoseconds for the driving signal VSFG. In other words, the feedback-based compensation circuit 120 requires about 100 nanoseconds to adjust the current load ILA1 applied to the memory array 105 such that the read voltage VRDd applied to the memory array 105 matches the read voltage VRDs in the voltage driver 115. Such an adjustment delay can be problematic for certain implementations.

Figure 2:
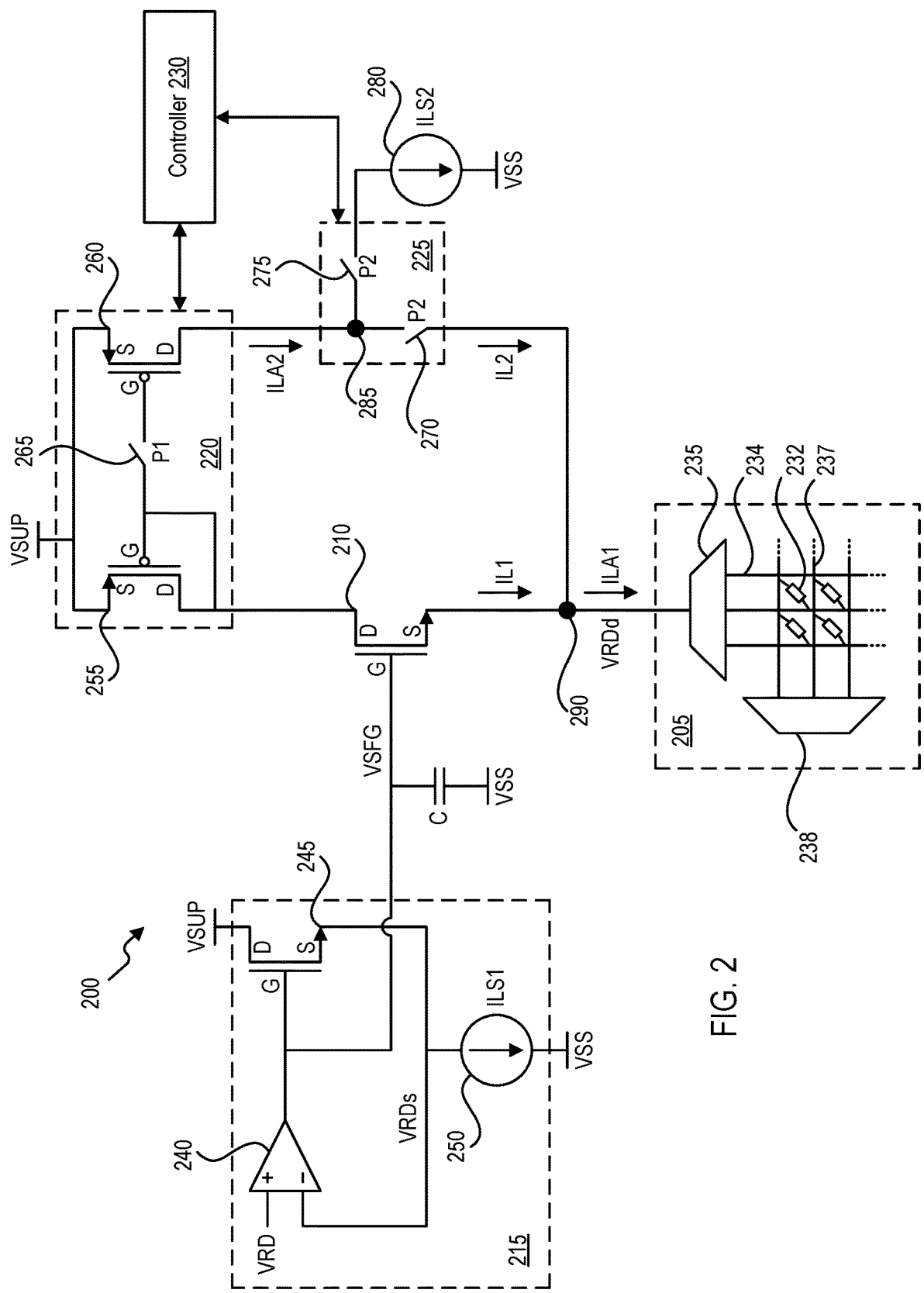
FIG. 2 illustrates an exemplary circuit diagram of a sense amplifier without feedback, in accordance with some embodiments.

FIG. 2 illustrates a circuit diagram for an exemplary embodiment of a sense amplifier 200 without feedback. The sense amplifier 200 illustrated in FIG. 2 includes a memory array 205, a source follower transistor 210, a driver 215, a detection circuit 220, a current adjustment circuit 225, and a controller 230. The sense amplifier 200 adjusts a read voltage VRDd applied to the memory array 205 to match a read voltage VRDs in the driver 215 during a read operation of the memory array 205 faster than a feedback-based architecture (such as the sense amplifier configuration 100 with feedback illustrated in FIG. 1). Thus, a memory device including the sense amplifier 200 illustrated in FIG. 2 performs read operations of a memory array faster than a memory device including a feedback-based architecture (such as the sense amplifier configuration 100 with feedback illustrated in FIG. 1). A similar architecture as the one illustrated in FIG. 2 (and described herein) may also be used to match write voltages during write operations of the memory array 205.

The memory array 205 illustrated in FIG. 2 includes a plurality of memory cells (including, for example, memory cell 232), a plurality of bit lines (including, for example, bit line 234), a bit line signal router 235, a plurality of word lines (including, for example, word line 237), and a word line signal router 238. While FIG. 2 illustrates a 2×2 array having four memory cells, three bit lines, and three word lines, in practice the memory array 205 may be an M×N array having M×N memory cells, M word lines, and N bit lines. The plurality of memory cells are arranged in a matrix-like configuration between the plurality of bits lines and the plurality of word lines such that each memory cell is disposed between one bit line and one word line. Each memory cell stores information based on an electrical characteristic (for example, resistance, spin, magnetic movement, etc.).

In operation, the source follower transistor 210 (also known as a buffer amplifier) communicates a load current IL1 (an example of a "first current") to a selected control line (i.e., a bit line or a word line) in the memory array 205 during a control operation (for example, a memory operation such as a read operation or a write operation). As used herein, the term "control line" is defined as any line coupled to the memory array 205 used for performing a memory operation such as a read operation, a write/program operation, an erase operation, or the like. Examples of control lines include a bit line, a word line, a source line, a drain line, and the like. In some embodiments, such as the one illustrated in FIG. 2, during a read operation of the memory array 205, the source follower transistor 210 applies the load current IL1 to one or more of a plurality of bit lines via the bit line signal router 235. For example, the source follower transistor 210 applies the load current IL1 to bit line 234 via the bit line signal router 235. Alternatively, or in addition, during a write operation of the memory array 205, the source follower transistor 210 applies the load current IL1 to one or more of the plurality of word lines via the word line signal router 238. For example, the source follower transistor 210 applies the load current IL1 to word line 237 via the word line signal router 238.

The driver 215 controls the application of the load current IL1 communicated to the memory array 205 based on a read voltage VRD received by the driver 215. In the embodiment illustrated in FIG. 2, the output of the driver 215 is connected to a control terminal (for example, the gate terminal) of the source follower transistor 210, and the driver 215 controls the application of the load current IL1 communicated to the memory array 205 by generating a driving signal VSFG which regulates the amount of current flowing through the source follower transistor 210 (i.e., the load current IL1). Alternatively, or in addition, the driver 215 directly applies the load current IL1 to the memory array 205. While FIG. 2 illustrates a single instance of the source follower transistor 210, in practice, several instances of the source follower transistor 210 are operatively connected in parallel to the driver 215.

In the embodiment illustrated in FIG. 2, the driver 215 includes an operational amplifier 240, a transistor 245, and a current source 250. The operational amplifier 240 includes a non-inverting input, an inverting input, and an output. The non-inverting input of the operational amplifier 240 receives the read voltage VRD. The output of the operational amplifier 240 is connected to the transistor 245, namely to its gate terminal. In addition, the output of the operational amplifier 240 forms the output of the driver 215. The drain terminal of the transistor 245 is connected to a supplemental voltage supply VSUP. The source terminal of the transistor 245 is connected to the current source 250 and to the inverting input of the operational amplifier 240. In this manner, the inverting input of the operational amplifier 240 receives a read voltage VRDs. The current source 250 adjusts the read voltage VRDs received by the inverting input of the operational amplifier 240 by absorbing a source current ILS1 from the signal generated at the source terminal of the transistor 245.

As described in more detail below, the detection circuit 220 is configured to sense and generate a copy of the load current IL1 applied by the source follower transistor 210 when the load IL1 applied by the source follower transistor 210 is equal to the load current ILA1 received by the memory array 205. As the load current IL1 applied by the source follower transistor 210 is equal to the difference between the load current ILA1 received by the memory array 205 and a load current IL2 applied (or absorbed) by the current adjustment circuit 225, the detection circuit 220 senses the load current IL1 applied by the source follower transistor 210 only when the current adjustment circuit 225 is not adjusting the load current IL1 applied by the source follower transistor 210 (i.e., when the load current IL2 is effectively zero). In this manner, the detection circuit 220 senses the load current IL1 applied to a selected control line of the memory array 205 by the source follower transistor 210. In addition, as described in more detail below, the detection circuit 220 communicates, to the current adjustment circuit 225, a load current ILA2 (an example of a "second current") that approximates the load current ILA1 received by the memory array 205. For example, the load current ILA2 communicated to the current adjustment circuit 225 mirrors the load current IL1 applied to a selected control line of the memory array 205 by the source follower transistor 210.

In the embodiment illustrated in FIG. 2, the detection circuit 220 includes two transistors 255 and 260. In some embodiments, the two transistors 255 and 260 are p-channel metal-oxide-semiconductor field-effect transistors (MOSFETs), as illustrated in FIG. 2. In alternate embodiments, the two transistors 255 and 260 are p-channel junction field-effect transistors (JFETs) or PNP bipolar junction transistors (BJTs). Together, the two transistors 255 and 260 form a current mirror. The transistor 255 (an example of a "first transistor") samples the load current IL1 applied to the memory array 205 by the source follower transistor 210. For example, the transistor 255 samples the load current IL1 applied to a selected control line of the memory array 205 by the source follower transistor 210. In the embodiment illustrated in FIG. 2, the transistor 255 is connected to the source follower transistor 210, namely the drain terminal of the transistor 255 is connected to the drain terminal of the source follower transistor 210. In addition, the drain and the gate terminals of the transistor 255 are connected to each other. The source terminal of the transistor 255 is connected to the supplemental voltage supply VSUP. The transistor 260 (an example of a "second transistor") applies a load current ILA2 to the current adjustment circuit 225. The load current ILA2 matches the load current IL1 sensed by the transistor 255. For example, the transistor 260 applies a load current ILA2 to the current adjustment circuit 225 that mirrors the load current IL1 applied to the memory array 205 by the source follower transistor 210 (an example of a "third transistor"). In the embodiment illustrated in FIG. 2, the drain terminal of the transistor 260 is connected to the current adjustment circuit 225 and the source terminal of the transistor 260 is connected to the supplemental voltage supply VSUP.

In the embodiment illustrated in FIG. 2, the detection circuit 220 also includes a switch 265 connected in series between the control terminals (for example, the gate terminals) of the two transistors 255 and 260. The switch 265 (an example of a "first switch") selectively connects and disconnects the control terminals of the two transistors 255 and 260 in response to a control signal P1. For example, the switch 265 has a conductive mode in which the switch 265 connects the control terminals of the two transistors 255 and 260, and a non-conductive mode in which the switch 265 disconnects the control terminals of the two transistors 255 and 260. In the conductive mode, the switch 265 connects the control terminals of the two transistors 255 and 260 such that the detection circuit 220 senses the load current IL1 applied by the source follower transistor 210. In the non-conductive mode, the switch 265 disconnects the control terminals of the two transistors 255 and 260 such that the detection circuit 220 does not sense the load current IL1 applied by the source follower transistor 210. In some embodiments, the switch 265 comprises a transistor (for example, a MOSFET, a JFET, or a BJT). When the switch 265 changes from the conductive mode to the non-conductive mode, the control terminal of the transistor 260 is floating, and thus the transistor 260 continuously applies a load current ILA2 to the current adjustment circuit 225. The load current ILA2 matches the most recent load current IL1 sampled by the transistor 255. In other words, when the switch 265 changes from the conductive mode to the non-conductive mode, the detection circuit 220 stops sampling the load current IL1 applied by the source follower transistor 210, but still applies a load current ILA2 to the current adjustment circuit 225. The load current ILA2 matches the most recent load current IL1 sampled by the detection circuit 220.

As described in more detail below, in order for the current adjustment circuit 225 to adjust the load current IL1 applied by the source follower transistor 210 during a read operation, the current adjustment circuit 225 should receive, among other things, a load current ILA2 matching the unadjusted load current IL1 applied by the source follower transistor 210. The load current ILA1 received by the memory array 205 is equal to the sum of the load current IL1 applied by the source follower transistor 210 and the load current IL2 applied (or absorbed) by the current adjustment circuit 225. Thus, in an initial state at the start of a read operation, before the current adjustment circuit 225 adjusts the load current IL1, the switch 265 is placed in the conductive mode so that the detection circuit 220 senses only the load current IL1 applied to the memory array 205 by the source follower transistor 210. In a subsequent state during a read operation, when the current adjustment circuit 225 starts adjusting the load current IL1, the switch 265 is placed in the non-conductive mode so that the current adjustment circuit 225 receives a load current ILA2 matching the unadjusted load current IL1. If the detection circuit 220 were to continue sensing the load current IL1 while the current adjustment circuit 225 adjusts the load current ILL the load current ILA2 generated by the detection circuit 220 would not match the unadjusted load current IL1. Instead, it would match the load current IL1 as adjusted by the load current IL2 applied (or absorbed) by the current adjustment circuit 225. Thus, by selectively connecting the control terminals of the two transistors 255 and 260, the switch 265 allows the detection circuit 220 to sense the load current IL1 applied by the source follower transistor 210 before the current adjustment circuit 225 adjusts the load current ILL and then replicate the unadjusted load current IL1 while the current adjustment circuit 225 adjusts the load current IL1. The current adjustment circuit 225 adjusts the load current IL1 applied by the source follower transistor 210 by changing the magnitude of the load IL2. In the embodiment illustrated in FIG. 2, the current adjustment circuit 225 includes two switches 270 and 275. In some embodiments, the two switches 270 and 275 comprise transistors (for example, MOSFETs, JFETs, or BJTs). In one embodiment, switch 270 (an example of a "second switch") is connected between the drain terminal of the transistor 260 and the memory array 205. Switch 275 (an example of a "third switch") is connected between the drain terminal of the transistor 260 and a current source 280. The two switches 270 and 275 are connected together with the drain terminal of the transistor 260 at a first junction 285. As used herein, the term "junction" is defined as a point where three or more branches of a circuit connect together.

The switch 270 selectively connects and disconnects the first junction 285 and the memory array 205 in response to a control signal P2. For example, the switch 270 has a conductive mode in which the switch 270 connects the first junction 285 and the memory array 205, and a non-conductive mode in which the switch 270 disconnects the first junction 285 and the memory array 205. The switch 275 selectively connects and disconnects the first junction 285 and the current source 280 in response to the control signal P2. For example, the switch 275 has a conductive mode in which the switch 275 connects the first junction 285 and the current source 280, and a non-conductive mode in which the switch 275 disconnects the first junction 285 and the current source 280. The two switches 270 and 275 are commonly controlled by the control signal P2 such that they are both either in the non-conductive mode or in the conductive mode. An output of the current adjustment circuit 225 is connected to the memory array 205 and to the source follower transistor 210 at a second junction 290. When the two switches 270 and 275 are in their conductive modes, the current adjustment circuit 225 adjusts the load current IL1 applied by the source follower transistor 210 by outputting the load current IL2. Alternatively, when the two switches 270 and 275 are in their non-conductive mode, the current adjustment circuit 225 does not adjust the load current IL1 applied by the source follower transistor 210 because the current adjustment circuit 225 does not output a load current IL2.

As described above, the current source 250 in the driver 215 absorbs a source current ILS1. The current source 280 communicates (i.e., absorbs) a source current ILS2 to the current adjustment circuit 225. The current source 280 (an example of a "first current source") is configured such that it absorbs a source current ILS2 (an example of a "third current") that matches (or approximates) the source current ILS1 (an example of a "fourth current") absorbed by the current source 250 (an example of a "second current source"). In one embodiment, the current source 280 absorbs the same amount of current as the current source 250. In another embodiment, differences between components that are exhibited due to process, voltage or temperature differences result in the current source 280 absorbing a different amount of current than the current source 250. In some embodiments, the current source 280 receives a signal from the current source 250 indicating the amount of the source current ILS1 absorbed by the current source 250. The current source 280 uses the signal to adjust the amount of the source current ILS2 it absorbs from the current adjustment circuit 225.

The load current IL2 communicated to the memory array 205 from the current adjustment circuit 225 (i.e., the current flowing through the switch 270 when in its conductive mode) is substantially equal to the difference between the unadjusted load current IL1 applied to the memory array 205 by the source follower transistor 210 and the source current ILS1 absorbed by the current source 250 in the driver 215 (i.e., IL2=ILA2−ILS2, ILA2≈ILA1, ILS2≈ILS1, =>IL2≈ILA1−ILS1). The load current IL1 applied by the source follower transistor 210 is equal to the difference between the load current ILA1 received by the memory array 205 and the load current IL2 communicated from the current adjustment circuit 225. As the load current IL2 communicated from the current adjustment circuit 225 represents the difference between the unadjusted load current IL1 and the source current ILS1, combining the load current IL1 and the load current IL2 at the second junction 290 results in the load current IL1 changing to match the source current ILS1 in the driver 215. The output impedance of the source follower transistor 210 changes when the load current IL1 applied the source follower transistor 210 changes. Thus. when the load current IL1 and the source current ILS1 are substantially equal, the output impedance of the source follower transistor 210 is substantially equal to the output impedance of the transistor 245 in the driver 215. For example, when the load current IL1 and the source current ILS1 are substantially equal, the output impedance at the source terminal of the source follower transistor 210 is substantially equal to the output impedance at the source terminal of the transistor 245 in the driver 215. When the output impedance of the source follower transistor 210 is substantially equal to the output impedance of the transistor 245 in the driver 215, the read voltage VRDd applied to the memory array 205 is substantially equal to the read voltage VRDs in the driver 215.

The current adjustment circuit 225 adjusts the load current IL1 applied by the source follower transistor 210 without providing a feedback signal to the driver 215. The driver 215 generates the driving signal VSFG without any feedback from the detection circuit 220 or from the current adjustment circuit 225. Thus, the driver 215 controls the application of the load current IL1 by the source follower transistor 210 independent of the load current ILA2 communicated to the current adjustment circuit 225 by the detection circuit 220 and independent of the source current ILS2 absorbed from the current adjustment circuit 225 by the current source 280.

As described above in relation to the sense amplifier configuration 100 with feedback illustrated in FIG. 1, adjusting the driving signal VSFG generated by the voltage driver 115 to adjust the load current ILA1 applied to the memory array 105 takes time (also known as "adjustment latency") due to high parasitic capacitances present between the voltage driver 115 and the sense amplifier circuit 110. In certain implementations, the adjustment latency can be longer than desired. As the parasitic capacitances present between the current adjustment circuit 225 and the source follower transistor 210 are much smaller, the current adjustment circuit 225 illustrated in FIG. 2 adjusts the load current IL1 applied by the source follower transistor 210 much faster (for example, shorter adjustment latency) than the feedback-based compensation circuit 120 illustrated in FIG. 1.

For example, the current adjustment circuit 225 adjusts the load current IL1 in about 5 to 10 nanoseconds, whereas the feedback-based compensation circuit 120 adjusts the load current ILA1 in about 100 nanoseconds. With its faster load current adjustment, the sense amplifier 200 illustrated in FIG. 2 adjusts the read voltage VRDd applied to the memory array 205 to match the read voltage VRDs in the driver 215 much faster than a feedback-based architecture (such as the sense amplifier configuration 100 with feedback illustrated in FIG. 1). Thus, a memory device including the sense amplifier 200 illustrated in FIG. 2 performs read operations of a memory array much faster than a memory device including a feedback-based architecture (such as the sense amplifier configuration 100 with feedback illustrated in FIG. 1).

In the embodiment illustrated in FIG. 2, the controller 230 is coupled to the detection circuit 220 and to the current adjustment circuit 225. The controller 230 is configured to manage the detection circuit 220 and the current adjustment circuit 225 such that the load current IL1 applied by the source follower transistor 210 is made proportional to the source current ILS2 communicated to the current adjustment circuit 225 by the current source 280. In some embodiments, the controller 230 provides the control signals P1 and P2 to the detection circuit 220 and to the current adjustment circuit 225, respectively.

Figure 3:
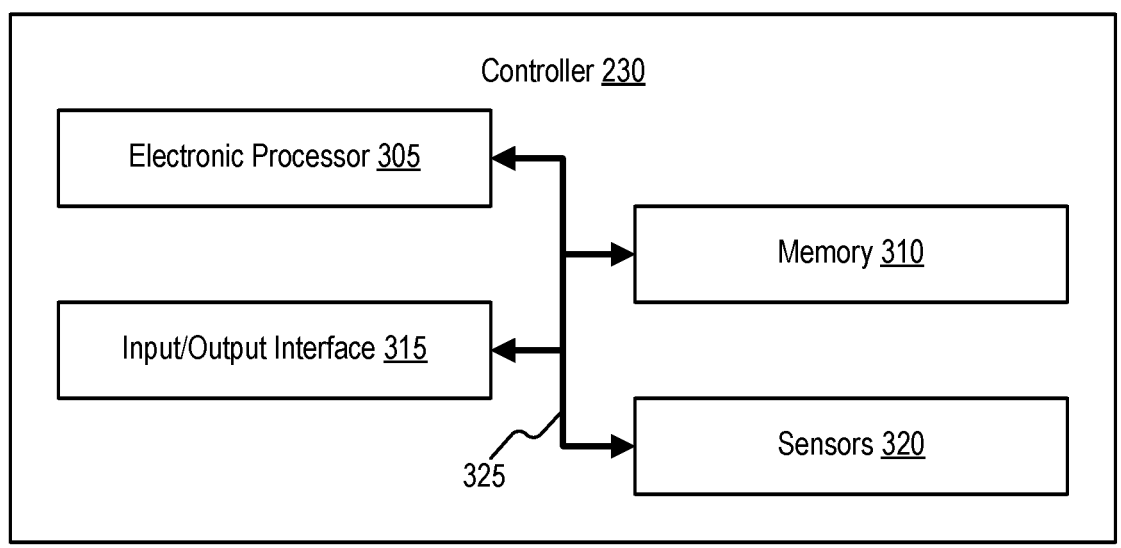
FIG. 3 illustrates an exemplary block diagram of a controller included in the sense amplifier of FIG. 2, in accordance with some embodiments.

FIG. 3 is an exemplary embodiment of the controller 230. In the embodiment illustrated in FIG. 3, the controller 230 includes an electronic processor 305 (for example, one or more microprocessors, ASICs, SoCs, or other electronic controllers), memory 310, an input/output interface 315, sensors 320, and a bus 325. The bus connects various components of the controller 230 including, for example, the memory 310 to the electronic processor 305. The memory 310 includes read only memory (ROM), random access memory (RAM), an electrically erasable programmable read-only memory (EEPROM), other non-transitory computer-readable media, or a combination thereof. The electronic processor 305, in one embodiment, is configured to retrieve program instructions and data from the memory 310 and execute, among other things, instructions to perform the methods described herein. Alternatively, or in addition to, the memory 310 is included in the electronic processor 305. The input/output interface 315 includes routines for transferring information between components within the controller 230 and other components of the sense amplifier 200, as well as components external to the sense amplifier 200. The input/output interface 315 is configured to transmit and receive signals via wires, fiber, wirelessly, or a combination thereof. Signals may include, for example, control signals, information, data, serial data, data packets, analog signals, or a combination thereof. The sensors 320 detect electrical characteristics of the sense amplifier 200. For example, the sensors 320 measure voltage and/or current values at various nodes and junctions of the sense amplifier 200. As used herein, the term "node" is defined as the connection of two or more elements in a circuit.

The controller 230 sets the modes (i.e., conductive or non-conductive) of the three switches 265, 270, and 275. For example, in some embodiments, the controller 230 sends the control signal P1 with a first voltage value to the switch 265, which causes the switch 265 to be in its non-conductive mode, and the controller 230 sends the control signal P1 with a second voltage value to the switch 265 which causes the switch 265 to be in its conductive mode. In some embodiments, the controller 230 sends the same control signal (for example, the control signal P2) to the two switches 270 and 275 such that the two switches 270 and 275 always have the same mode. For example, the controller 230 sends the control signal P2 with a first voltage value to the two switches 270 and 275 which causes the two switches 270 and 275 to be in their non-conductive modes, and the controller 230 sends the control signal P2 with a second voltage value to the two switches 270 and 275 which causes the two switches 270 and 275 to be in their conductive modes. In alternate embodiments, the controller 230 sends different control signals to the two switches 270 and 275. For example, the controller 230 sends the control signal P2 to the switch 270 and a separate control signal (for example, a control signal P3) to the switch 275.

The controller 230 implements a first state in which the detection circuit 220 does not sense the load current IL1 applied by the source follower transistor 210 to the memory array 205 and the current adjustment circuit 225 does not adjust the load current IL1 applied by the source follower transistor 210. The controller 230 also implements a second state in which the detection circuit 220 senses the load current IL1 applied by the source follower transistor 210 and the current adjustment circuit 225 does not adjust the load current IL1 applied by the source follower transistor 210. The controller 230 further implements a third state in which the detection circuit 220 does not sense the load current IL1 applied by the source follower transistor 210 and the current adjustment circuit 225 adjusts the load current IL1 applied by the source follower transistor 210.

Figure 4:
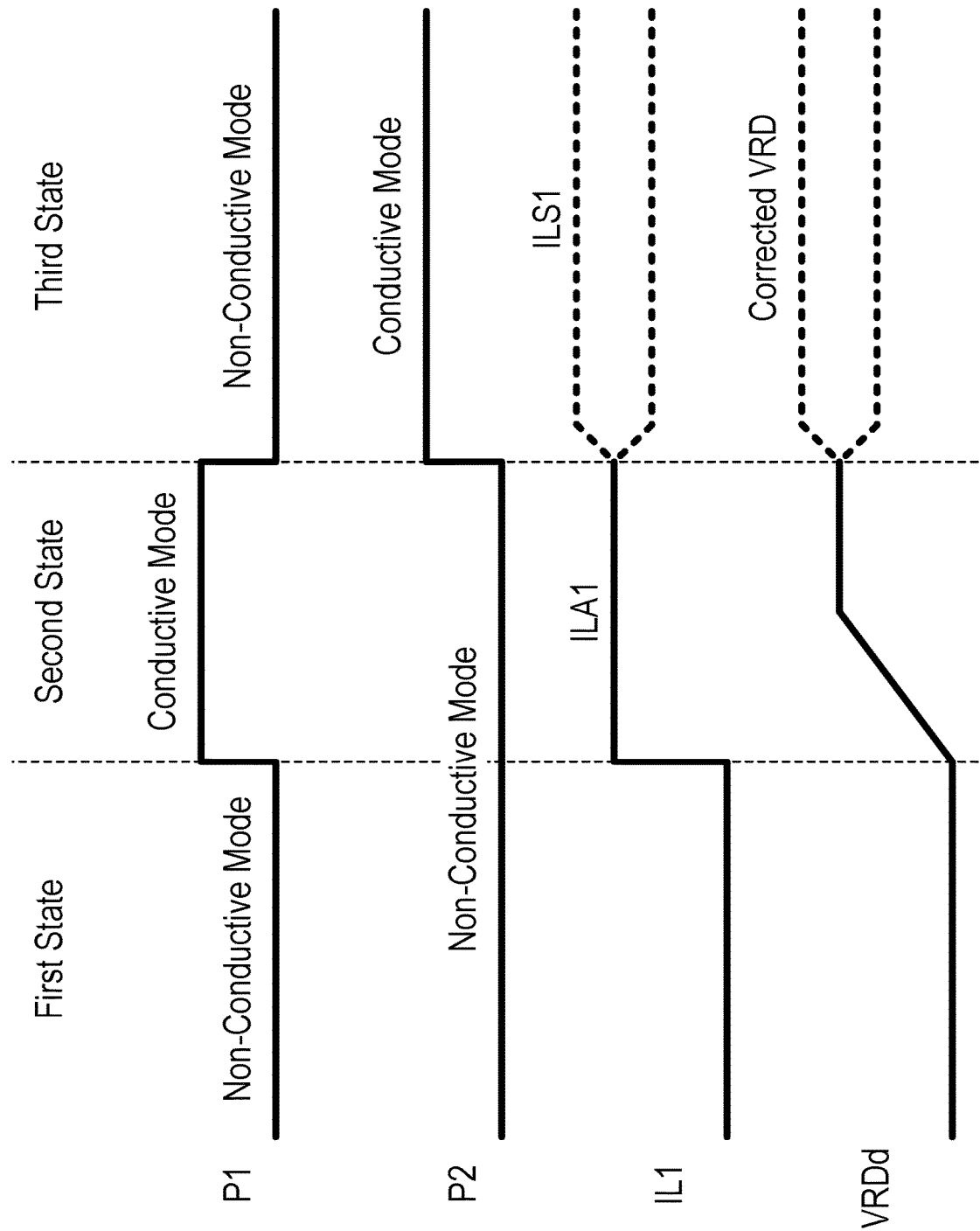
FIG. 4 illustrates an exemplary timing diagram for a read operation associated with a memory array, in accordance with some embodiments.

In some embodiments, the controller 230 implements the first, second, and third states by sending the control signal P1 to the switch 265 and sending the control signal P2 to the two switches 270 and 275. FIG. 4 illustrates an exemplary timing diagram of the control signals P1 and P2 generated by the controller 230 during a read operation of the memory array 205. FIG. 4 also illustrates the read voltage VRDd and the load current IL1 applied by the source follower transistor 210 during the read operation. The controller 230 may generate similar control signals as the ones illustrated in FIG. 4 during other control operations such as write operations. In the embodiment illustrated in FIG. 4, the first state represents a state prior to performing the read operation of the memory array 205.

In the first state, the switch 265 (due to the voltage value of the control signal P1) is in its non-conductive mode, and thus the detection circuit 220 does not sense the load current IL1 applied by the source follower transistor 210. Also, in the first state, the two switches 270 and 275 (due to the voltage of the control signal P2) are in their non-conductive modes, and thus the current adjustment circuit 225 does not adjust the load current IL1 applied by the source follower transistor 210. While FIG. 4 illustrates low and high voltage values of the control signals P1 and P2 as corresponding to the non-conductive and conductive modes, respectively, of the three switches 265, 270, and 275, this is merely illustrative and is not exhaustive. In some embodiments, some or all of the three switches 265, 270, or 275 may be constructed such that they are placed in their conductive mode by a low voltage value and in their non-conductive mode by a high voltage value.

Upon detection of a read operation of the memory array 205, the controller 230 changes from the first state to the second state. In some embodiments, the controller 230 detects the read operation in response to receiving a read command, for example, from a user. Alternatively, or in addition, the controller 230 detects the read operation by detecting a rise in a read voltage (for example, the read voltage VRD, the read voltage VRDs, or the read voltage VRDd), a rise in the load current ILL or both. In the second state, the driver 215 applies the driving signal VSFG to the source follower transistor 210, which causes the source follower transistor 210 to apply the load current IL1 to the memory array 205. As illustrated in the timing diagram in FIG. 4, the read voltage VRDd applied to the memory array 205 increases over time and reaches a steady-state. In the second state, the switch 265 (due to the voltage value of the control signal P1) is in its conductive mode, and thus the detection circuit 220 senses the load current IL1 applied by the source follower transistor 210. Also, in the second state, the two switches 270 and 275 (due to the voltage value of the control signal P2) are in their non-conductive modes, and thus the current adjustment circuit 225 does not adjust the load current IL1 applied by the source follower transistor. As the switch 270 is in its non-conductive mode in the second state, the load current IL1 applied by the source follower transistor 210 is equal to the load current ILA1 received by the memory array 205.

After the read voltage VRDd reaches a steady-state, the controller 230 changes from the second state to the third state. In some embodiments, the controller 230 changes from the second state to the third state after a predetermined period of time following a detection of the start of a read operation of the memory array 205. The predetermined period of time may be set such that the read voltage VRDd has sufficient time to reach a steady-state. For example, the controller 230 changes from the second state to the third state approximately 50 nanoseconds following the detection of the start of a read operation. Alternatively, or in addition, the controller 230 monitors, for example, the read voltage VRDd and changes from the second state to the third state when the controller 230 detects that the read voltage VRDd is in a steady-state for a predetermined period of time.

In the third state, the switch 265 (due to the voltage value of the control signal P1) is in its non-conductive mode, and thus the detection circuit 220 does not sense the load current IL1 applied by the source follower transistor 210. Also, in the third state, the two switches 270 and 275 (due to the voltage value of the control signal P2, the control signal P3, or both) are in their conductive modes, and thus the current adjustment circuit 225 adjusts the load current IL1 applied by the source follower transistor 210. In the third state, the detection circuit 220 communicates the load current ILA2 to the current adjustment circuit 225 and the current source 280 absorbs the source current ILS2 from the current adjustment circuit 225. The load current ILA2 communicated to the current adjustment circuit 225 from the detection circuit 220 in the third state approximates the unadjusted load current IL1 applied by the source follower transistor 210 when the read voltage VRDd is in a steady-state. The current adjustment circuit 225 communicates the load current IL2 to the memory array 205. As described above, the load current IL2 communicated to the memory array 205 by the current adjustment circuit 225 represents the difference between the load current ILA2 communicated to the current adjustment circuit 225 by the detection circuit 220 and the source current ILS2 absorbed by the current source 280. In this manner, the load current IL1 applied by the source follower transistor 210 is adjusted to match the source current ILS1 in the driver 215, which, as described above, in turn causes the read voltage VRDd applied to the memory array 205 to match the read voltage VRDs in the driver 215.

The controller 230 changes from the third state to the first state upon detection that the read operation is complete. In some embodiments, the controller 230 detects the read operation is complete by waiting for a predetermined period of time following the change from the first state to the second state. The predetermined period of time includes, for example, the time it takes for the current adjustment circuit 225 to adjust the load current IL1 applied by the source follower transistor 210 to match the source current ILS1 in the driver 215, and the time it takes to complete the read operation after the load current IL1 is adjusted. As described above, the current adjustment circuit 225 adjusts the load current IL1 applied by the source follower transistor 210 in about 5 to 10 nanoseconds. Thus, in some embodiments, the controller 230 changes from the third state to the first state about 20 nanoseconds after the change from the first state to the second state.

In connection with disclosed embodiments, an apparatus includes means for storing data. For example, the means for storing data may correspond to the memory array 205.

The apparatus also includes means for sampling a first current applied to the means for storing data upon detection of a memory operation associated with the means for storing data. For example, the means for the sampling the first current may correspond to the transistor 255, the switch 265, the detection circuit 220, the controller 230, or a combination thereof. In some embodiments, the means for sampling the first current is configured to sample the first current only during a predetermined period of time following the detection of the memory operation.

The apparatus also includes means for applying a second current to the means for storing data, wherein the means for applying the second current is configured to match the second current to the first current. For example, the means for applying the second current may correspond to the transistor 260, the detection circuit 220, the switch 270, the current adjustment circuit 225, the controller 230, or a combination thereof. In some embodiments, the means for applying the second current is configured to apply the second current to the means for storing data only after a predetermined period of time following the detection of the memory operation.

The apparatus also includes means for absorbing a third current from the means for storing data only when the second current is applied to the means for storing data. For example, the means for absorbing a third current may correspond to the current source 280, the switch 270, the switch 275, the current adjustment circuit 225, the controller 230, or a combination thereof.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A circuit, comprising:
a first transistor configured to sample a first current of a control line;
a second transistor;
a first switch connected in series between a control terminal of the first transistor and a control terminal of the second transistor;
a second switch connected between the second transistor and the control line;
a first current source; and
a third switch connected between the first current source and a node common to the second transistor and the second switch,
wherein the control line includes at least one selected from a group consisting of a word line and a bit line.

2. The circuit according to claim 1, wherein the first current source is configured to absorb a third current from the control line.

3. The circuit according to claim 2, further comprising a driver configured to control application of the first current to the control line, wherein the driver including a second current source configured to absorb a fourth current, the first current source configured to match the third current to the fourth current.

4. The circuit according to claim 3, wherein the driver is configured to control application of the first current to the control line independent of the second current and the third current.

5. The circuit according to claim 3, wherein a third transistor is connected in series between the first transistor and the control line, and wherein a control terminal of the third transistor is connected to the driver.

6. The circuit according to claim 1, wherein the first transistor and the second transistor are field-effect transistors, and wherein the control terminal of the first transistor and the control terminal of the second transistor are gate terminals.

7. The circuit according to claim 1, wherein the first transistor and the second transistor are p-channel transistors.

8. A system comprising:
the circuit according to claim 1; and
a controller is configured to implement
a first state in which the first switch is in a non-conductive mode, the second switch is in the non-conductive mode, and the third switch is in the non-conductive mode,
a second state in which the first switch is in a conductive mode, the second switch is in the non-conductive mode, and the third switch is in the non-conductive mode, and
a third state in which the first switch is in the non-conductive mode, the second switch is in the conductive mode, and the third switch is in the conductive mode.

9. The system according to claim 8, wherein the control line is coupled to a memory array, wherein the controller is further configured to change from the first state to the second state upon detection of a control operation associated with the memory array, and wherein the control operation includes at least one selected from a group consisting of a read operation and a write operation.

10. The system according to claim 9, wherein the controller is further configured to change from the second state to the third state after a predetermined period of time following the detection of the control operation.

11. The system according to claim 10, wherein the controller is further configured to change from the third state to the first state upon detection that the control operation is complete.

* * * * *